(12) United States Patent
Liu et al.

(10) Patent No.: US 6,221,703 B1
(45) Date of Patent: Apr. 24, 2001

(54) METHOD OF ION IMPLANTATION FOR ADJUSTING THE THRESHOLD VOLTAGE OF MOS TRANSISTORS

(75) Inventors: Chih-Cheng Liu, Pan-Chiao; Chin-Hui Lee, Taipei, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/352,749

(22) Filed: Jul. 14, 1999

(51) Int. Cl.[7] .................................................. H10L 21/339
(52) U.S. Cl. .......................... 438/174; 438/302; 257/372
(58) Field of Search .................................. 438/174, 194, 438/217, 266, 276, 163, 289, 302; 257/519, 270, 372, 332

(56) References Cited

U.S. PATENT DOCUMENTS 5,399,895 * 3/1995 Koga ...................................... 257/372
6,020,244 * 2/2000 Thompson et al. ................... 438/302
6,034,396 * 3/2000 Wu ........................................ 438/174

* cited by examiner

Primary Examiner—David Nelms
Assistant Examiner—Dung A Le
(74) Attorney, Agent, or Firm—Winston Hsu

(57) ABSTRACT

The invention relates to an ion implantation method for adjusting the threshold voltage of MOS transistors. The MOS transistor is employed in a DRAM (dynamic random access memory) memory cell in a semiconductor wafer and comprises a substrate, a gate insulating layer positioned on the substrate, and a gate conducting layer with a rectangular-shaped cross section positioned on the gate insulating layer. The method comprises performing an ion implantation process at a predetermined dosage and ion energy to implant dopants through the gate conducting layer and gate insulating layer and deposit the dopants into the superficial portion of the substrate below the gate insulating layer.

5 Claims, 4 Drawing Sheets

METHOD OF ION IMPLANTATION FOR ADJUSTING THE THRESHOLD VOLTAGE OF MOS TRANSISTORS

BACKGROUND OF THE INVENTION

1. Field of the Invention

The invention relates to an ion implantation method, and more particularly, to an ion implantation method for adjusting the threshold voltage of MOS transistors.

2. Description of the Prior Art

The metal-oxide semiconductor (MOS) transistor is an electric component commonly used in integrated circuits. MOS transistors are four-connecting-point components composed of a gate, a source and a drain.

Please refer to FIG. 1. FIG. 1 is a perspective diagram of a prior art MOS transistor 40 on a semiconductor wafer 10. The MOS transistor 40 comprises a gate 22, source 30 and drain 32. Shallow trenches 14 or FOX (field oxide) positioned around the MOS transistor 40 isolate it from other components.

Please refer to FIG. 2 to FIG. 4. FIG. 2 to FIG. 4 are perspective diagrams of producing the MOS transistor 40 in FIG. 1. First, shallow trenches 14 are formed on the P-type Si substrate 12 of the semiconductor wafer 10. Dopants $B^{11}$ or $BF_2^+$ are implanted in areas surrounding the shallow trenches 14 to form an impurity region 16. This is accomplished by ion implantation at a threshold voltage $V_t$ and dosage of $5 \times 10^{11} \sim 5 \times 10^{12}$ atoms/cm². Then, thermal oxidation is performed to form a 40~®Å silicon oxide layer on the surface of the Si substrate 12 followed by in-situ phosphorus doped LPCVD to form a 500~1000 Å poly-silicon layer on the surface of the silicon oxide layer. The silicon oxide layer and poly-silicon layer are etched by photolithography and etching to severally form a gate insulating layer 18 and gate conducting layer 20 with rectangular-shaped cross sections. This completes formation of the gate 22.

Then, an ion implantation process is performed to implant dopants $P^{31}$ or $As^{75}$ to form an $N^-$ lightly doped source 24 and drain 26 between the gate 22 and shallow trenches 14. A spacer 28 is then formed at two sides of the gate 22. Then, another ion implantation process is performed to implant dopants $As^{75}$ to form an $N^+$ heavily doped source 30 and drain 32 between the spacer 28 and shallow trenches 14. This completes the formation of the MOS transistor 40 of N-channel shown in FIG. 1.

As the size of the memory cell of the dynamic random access memory (DRAM) gets smaller, the width between the channel below the gate 22 of the MOS transistor 40 and the spacer 28 is smaller. Therefore, the impurity concentration of the impurity region 16 increases in proportion.

The impurity dosage required to form the source and drain is much greater than the dosage required to adjust the threshold voltage. When the dosage to adjust the threshold voltage is increased, the dosage of the source and drain is increased proportionately. However, as the dosage of the source and drain is increased, the junction leakage and junction capacitance of the MOS transistor 40 is greatly increased. But, when the dosage of the source 24 and drain 26 is decreased, the saturated drain current ($I_{dsant}$) of the MOS transistor is reduced which makes it difficult for the capacitance of the memory cell of DRAM to read and write signals.

SUMMARY OF THE INVENTION

It is therefore a primary objective of the present invention to provide a method of ion implantation for adjusting the threshold voltage of MOS transistors. The junction leakage and junction capacitance of the MOS transistor thus formed are reduced.

Briefly, in a preferred embodiment, the present invention provides a method of ion implantation for adjusting the threshold voltage of a metal-oxide semiconductor (MOS) transistor. The MOS transistor is employed in a DRAM (dynamic random access memory) memory cell in a semiconductor wafer and comprises a substrate, a gate insulating layer positioned on the substrate, and a gate conducting layer with a rectangular-shaped cross section positioned on the gate insulating layer. The method comprises: performing an ion implantation process at a predetermined dosage and ion energy to implant dopants through the gate conducting layer and gate insulating layer and deposit the dopants into the surface portion of the substrate below the gate insulating layer.

It is an advantage of the present invention that the method according to the present invention can generate an MOS transistor with a smaller gate and a reduced impurity dosage of the source and drain of the MOS transistor. Thus, the MOS transistor has a lower junction leakage and junction capacitance while the saturated drain current ($I_{dsant}$) of the MOS transistor is not reduced correspondingly. This prevents difficulties in reading and writing signals by the capacitance of the memory cell.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
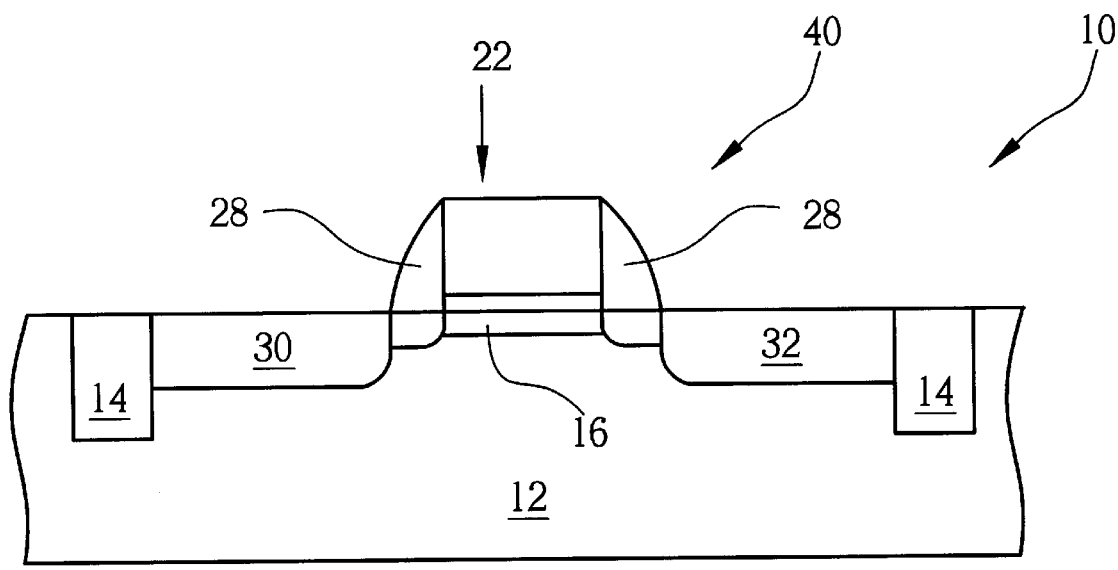
FIG. 1 is a perspective diagram of a prior art MOS transistor on a semiconductor wafer.
Figure 2:
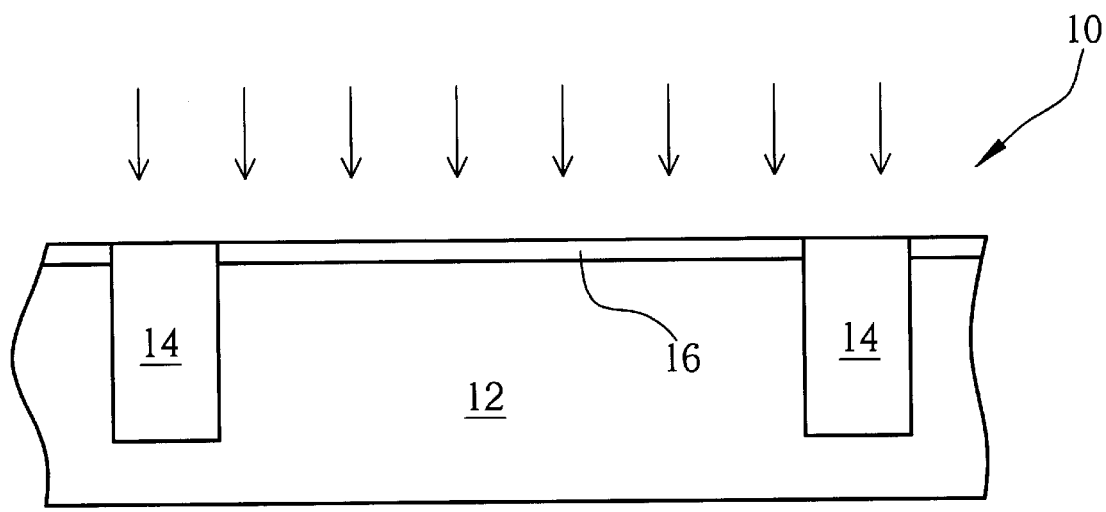
FIG. 2 to FIG. 4 are perspective diagrams of producing the MOS transistor in FIG. 1.
Figure 3:
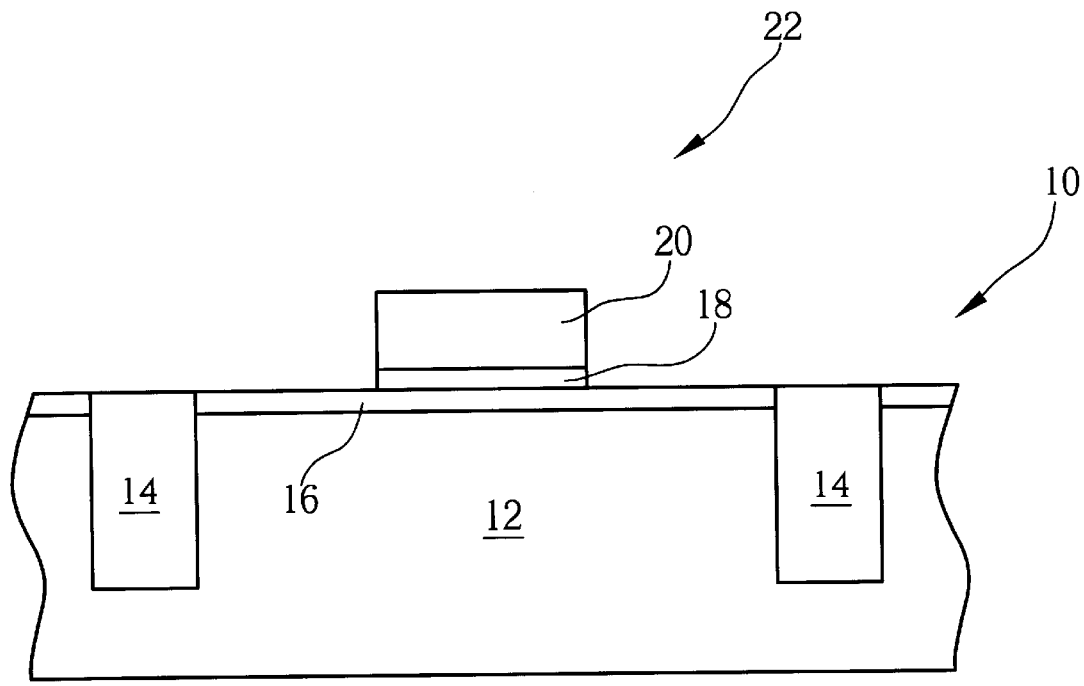
Figure 4:
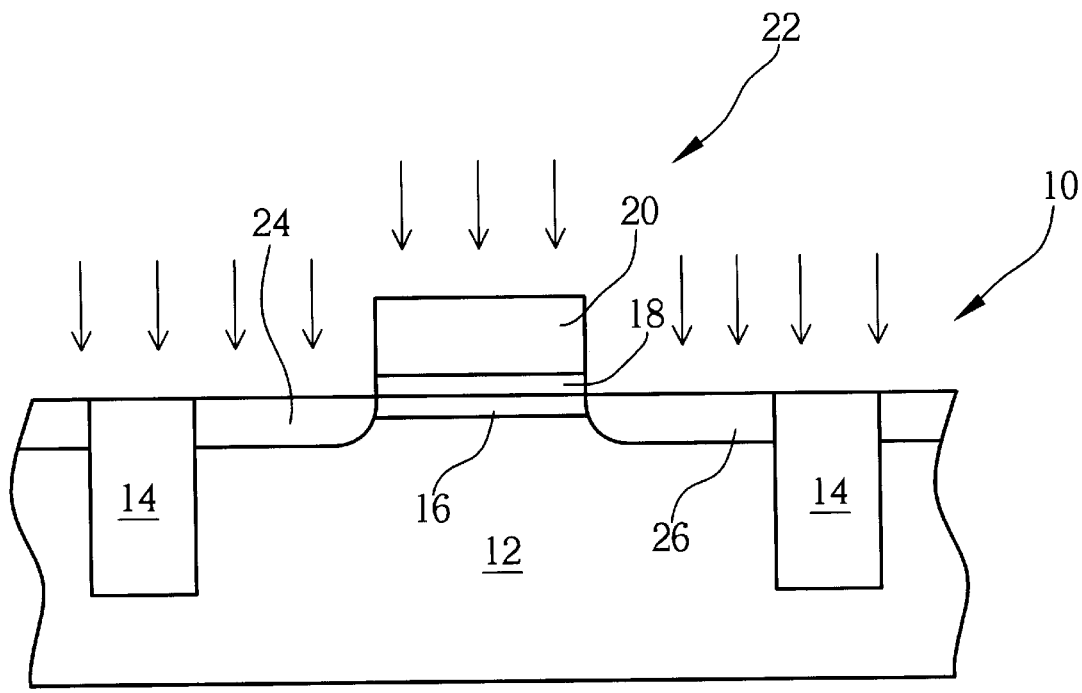
Figure 5:
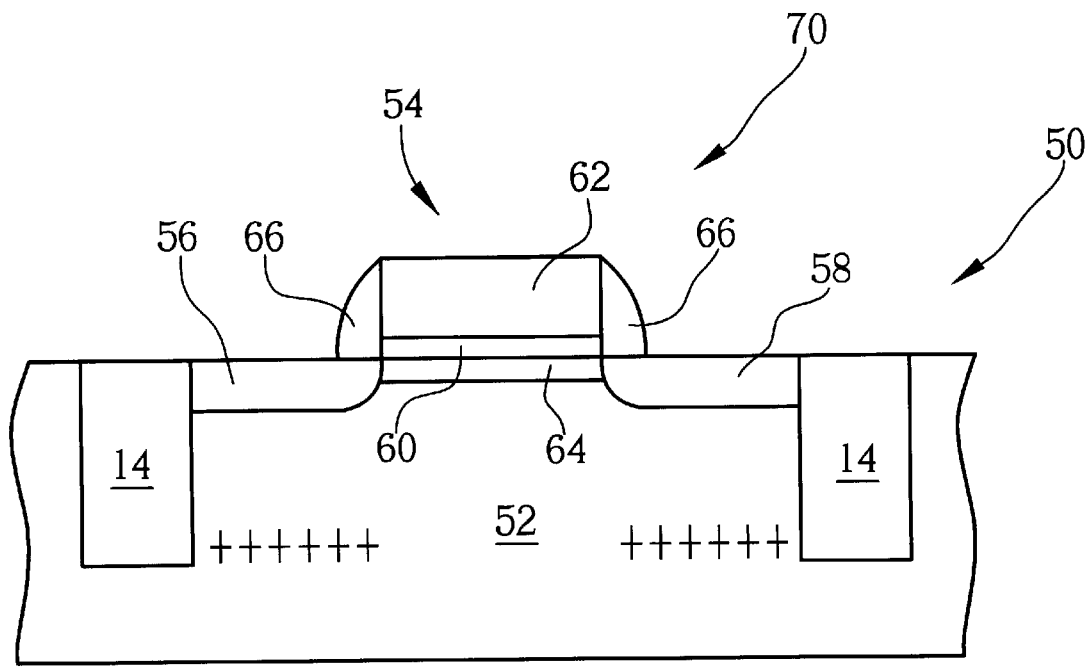
FIG. 5 is a perspective diagram of a MOS transistor produced by performing an ion implantation method according to the present invention.

Please refer to FIG. 5. FIG. 5 is a perspective diagram of a MOS transistor 70 produced by performing ion implantation according to the present invention. The present invention relates to a method of ion implantation for adjusting the threshold voltage of a MOS transistor 70. The MOS transistor 70 is positioned on a P-type Si substrate 52 and, along with a corresponding capacitor, composes a DRAM (dynamic random access memory) memory cell. The MOS transistor 70 comprises a gate 54, source 56 and drain 58. The gate 54 comprises a gate insulating layer 60 and a gate conducting layer 62. The gate insulating layer 60 is a silicon oxide layer, and the gate conducting layer 62 comprises a poly-silicon layer and a tungsten silicide layer positioned on the poly-silicon layer. The MOS transistor 70 is surrounded with insulating material formed by shallow trenches 14 or a FOX (field oxide) and prevents the MOS transistor 70 from contacting other components.

Figure 6:
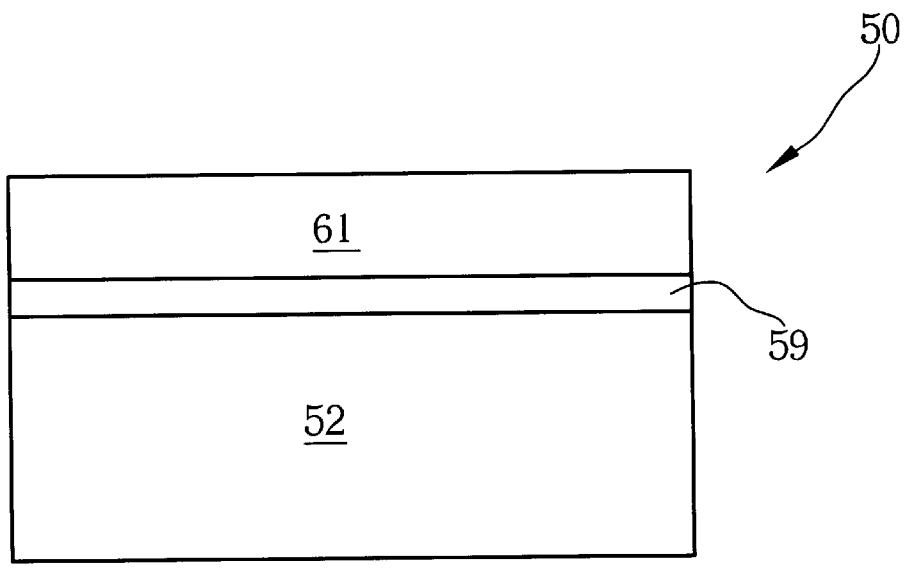
FIG. 6 to FIG. 8 are perspective diagrams of producing the MOS transistor in FIG. 5.
Figure 7:
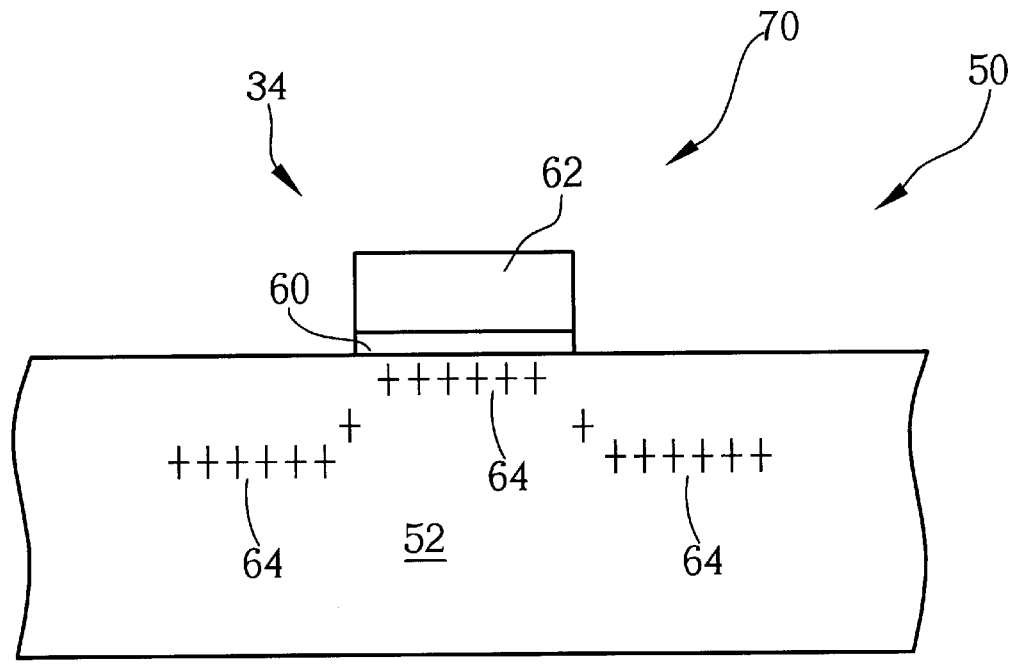
Figure 8:
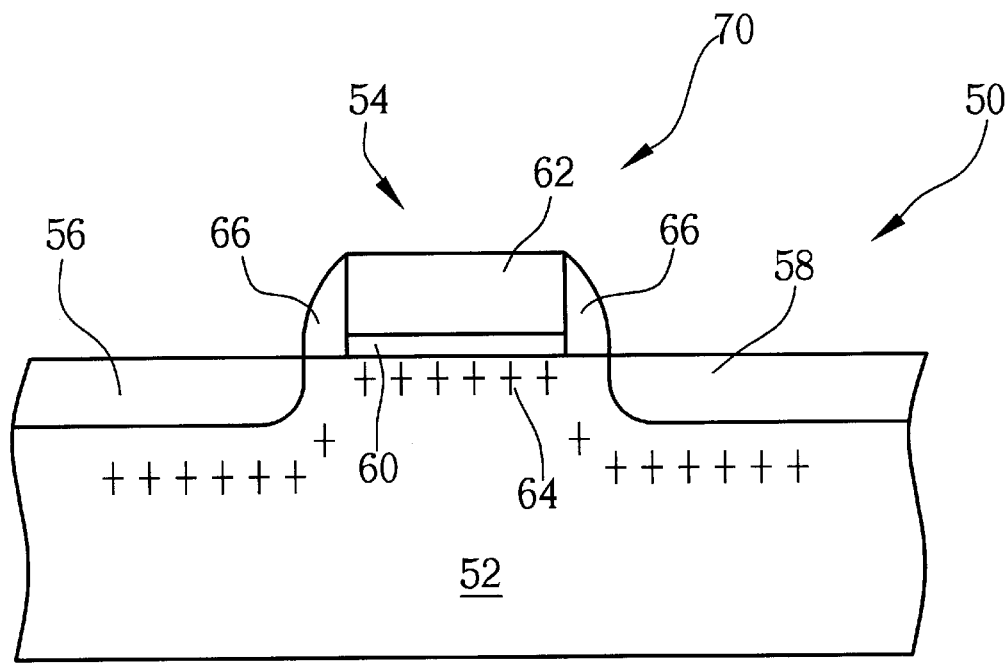

Please refer to FIG. 6 to FIG. 8. FIG. 6 to FIG. 8 are perspective diagrams of producing the MOS transistor 70 in FIG. 5. A silicon oxide layer 59 is formed on the surface of the Si substrate 52 by performing thermal oxidation. Then, a poly-silicon layer 61 is formed on the surface of the silicon oxide layer 59 by performing LPCVD, as shown in FIG. 6. By performing photolithography and etching, the silicon oxide layer 59 and poly-silicon layer 61 are etched to form a gate insulating layer 60 and a gate conducting layer 62 with rectangular-shaped cross sections, as shown in FIG. 7. Moreover, the tungsten silicide layer with a good electrical conduction is positioned on the poly-silicon layer of the gate conducting layer 62 as a contact interface.

Lithography is performed for forming a photo-resist layer (not shown) with a rectangular-shaped cross section in a predetermined area of the semiconductor wafer 50 outside the MOS transistor 70 to prevent the dopants of the ion implantation process from being implanted into the predetermined area. Then, an ion implantation process is performed at a threshold voltage $V_t$ on the surface of the semiconductor wafer 50 by using $B^{11}$ or $BF_2^+$ at a predetermined dosage and ion energy to implant dopants through the gate conducting layer 62 and gate insulating layer 60. This forms an impurity region 64 comprising $B^{11}$ or $BF_2^+$ at the predetermined area which is not covered by the photo-resist layer and deposits the dopants into the superficial portion of the substrate 52 below the gate insulating layer 62. The area labeled with a "+" sign represents the impurity region 64, and portions of the impurity region 64 below the gate conducting layer 62 or around the gate conducting layer 62 have different depths. The predetermined area which is not covered by the gate 54 is implanted with dopants below the substrate 52.

After a spacer 66 is formed at two sides of the gate 54, ion implantation is thus performed with dopants $P^{31}$ to form an N-type source 56 and drain 58 between the gate 54 and photo-resist layer.

When performing a threshold voltage ion implantation process, the method according to the present invention uses $B^{11}$ or $BF_2^+$ at a predetermined dosage and ion energy to implant dopants through the gate conducting layer 62 and gate insulating layer 60 to form an impurity region 64 comprising $B^{11}$ or $BF_2^+$ in the superficial portion of the substrate 52 below the gate insulating layer 62. The threshold voltage ion implantation process makes the predetermined area, which is not covered by the gate 54 and photo-resist layer, on the surface of the semiconductor wafer 50 to become implanted. The dopants implanted into the lower portion of the substrate 52 do not overlap with the impurity region of the source 56 and drain 58 that are formed sequentially. Therefore, the threshold voltage ion implantation process will not affect the impurity concentration of the source 56 and drain 58, and the saturated drain current ($I_{dsant}$) of the MOS transistor 70 is not reduced. This prevents difficulties for the capacitance of the memory cell of DRAM to read and write signals.

When performing the ion implantation process with $P^{31}$ to form the source 56 and drain 58 and to form the bit line contact and node contact, an LDD (lightly doped drain) structure of the N⁻ lightly doped source and drain is formed under the spacer 66. Therefore, a specific ion implantation process for LDD is not required for forming the MOS transistor 70. This method can be also used to form P-channel MOS transistors and CMOS.

In the prior art MOS transistor, the impurity dosage required to form the source and drain is much greater than the dosage required to adjust the threshold voltage which, in turn, is much greater than the impurity concentration of the Si substrate. In the process according to the present invention, as long as the impurity dosage of the source and drain and the dosage required to adjust the threshold voltage are each much greater than the impurity concentration of the Si substrate, the impurity dosage of the source and drain is greatly reduced. Therefore, no short channel effect occurs and the MOS transistor has lower junction leakage and junction capacitance.

Compared with the prior art MOS transistor, the method according to the present invention can generate an MOS transistor with a smaller gate and a reduced impurity dosage of the source and drain of the MOS transistor. Thus, the MOS transistor has lower junction leakage and junction capacitance and the saturated drain current ($I_{dsant}$) of the MOS transistor is not reduced. This prevents difficulties in the reading and writing of signals of the capacitance of the memory cell.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method of ion implantation for adjusting the threshold voltage and reducing the interface capacitance and interface leakage around S/D region obviously of a metal-oxide semiconductor (MOS) transistor, the MOS transistor being employed in a DRAM (dynamic random access memory) memory cell in a semiconductor wafer and comprising a substrate, a gate insulating layer positioned on the substrate, and a gate conducting layer with a rectangular-shaped cross section positioned on the gate insulating layer, the method comprising:

performing an ion implantation process at a predetermined dosage and ion energy to implant dopants through the gate conducting layer and gate insulating layer and deposit the dopants into the surface portion of the substrate below the gate insulating layer;

wherein the ion implantation process will not affect the impurity concentration of the source and drain, and the saturated drain current ($I_{dsant}$) of the MOS transistor is not reduced so as to reduce the interface capacitance and interface leakage around S/D region.

2. The method of claim 1 further comprising a lithography process performed prior to the ion implantation process for forming a photo-resist layer on a predetermined area of the semiconductor wafer outside the MOS transistor to prevent the dopants of the ion implantation process from being implanted into the predetermined area.

3. The method of claim 1 wherein the gate conducting layer comprises a poly-silicon layer positioned on the gate insulating layer, and a tungsten silicide layer positioned on the poly-silicon layer.

4. The method of claim 1 wherein the gate insulating layer is made of silicon oxide.

5. The method of claim 1 wherein the substrate is made of silicon.

* * * * *